United States Patent
Steiner et al.

(10) Patent No.: US 10,972,122 B2
(45) Date of Patent: Apr. 6, 2021

(54) SENSOR ARRANGEMENT

(71) Applicant: ams International AG, Rapperswil (CH)

(72) Inventors: Matthias Steiner, Rapperswil (CH); Thomas Froehlich, Rapperswil (CH)

(73) Assignee: AMS INTERNATIONAL AG, Rapperswil (CH)

( * ) Notice: Subject to any disclaimer, the term of this patent is extended or adjusted under 35 U.S.C. 154(b) by 0 days.

(21) Appl. No.: 16/757,615

(22) PCT Filed: Oct. 22, 2018

(86) PCT No.: PCT/EP2018/078878
§ 371 (c)(1),
(2) Date: Apr. 20, 2020

(87) PCT Pub. No.: WO2019/081422
PCT Pub. Date: May 2, 2019

(65) Prior Publication Data
US 2020/0328758 A1    Oct. 15, 2020

(30) Foreign Application Priority Data
Oct. 25, 2017   (EP) .................................... 17198335

(51) Int. Cl.
*H03M 1/66*     (2006.01)
*H03M 3/00*     (2006.01)
(Continued)

(52) U.S. Cl.
CPC .............. *H03M 3/464* (2013.01); *H03F 1/34* (2013.01); *H03F 3/181* (2013.01);
(Continued)

(58) Field of Classification Search
CPC ........ H03M 3/464; H03M 1/785; H03M 1/66; H03M 1/77; H03F 3/45475; H03F 3/181;
(Continued)

(56) References Cited

U.S. PATENT DOCUMENTS

| | | | |
|---|---|---|---|
| 4,922,756 A | 5/1990 | Henrion | |
| 6,753,801 B2 * | 6/2004 | Rossi | .................... H03F 3/005 |
| | | | 341/161 |

(Continued)

FOREIGN PATENT DOCUMENTS

| | | |
|---|---|---|
| EP | 2675188 | 12/2013 |
| EP | 3236588 | 10/2017 |

OTHER PUBLICATIONS

Bach, et al.: "A 1.8V True-Differential 140dB SPL Full-Scale Standard CMOS MEMS Digital Microphone Exhibiting 67dB SNR" Paper ISSCC 2017, session 9.5, p. 166-168.

(Continued)

*Primary Examiner* — Jean B Jeanglaude
(74) *Attorney, Agent, or Firm* — MH2 Technology Law Group LLP

(57) ABSTRACT

A sensor arrangement includes a sensor having a first terminal and a second terminal, and an amplifier having an amplifier input for applying an input signal and an amplifier output for providing an amplified input signal, the amplifier input being coupled to the second terminal. A quantizer having a quantizer input and a quantizer output is configured to provide a multi-level output signal on the basis of the amplified input signal and a feedback circuit having a feedback circuit input coupled to the quantizer output and a feedback circuit output coupled to the first terminal. The feedback circuit includes a digital-to-analog converter configured to generate an analog signal on the basis of the multi-level output signal, the analog signal being the basis of a feedback signal provided at the feedback circuit output, a (Continued)

feedback capacitor coupled between the feedback circuit output and an output of the digital-to-analog converter, and a voltage source coupled to the feedback circuit output.

14 Claims, 5 Drawing Sheets

(51) Int. Cl.
*H03F 1/34* (2006.01)
*H03F 3/181* (2006.01)
*H03F 3/45* (2006.01)
*H03F 3/70* (2006.01)
*H03M 1/78* (2006.01)
*H04R 19/04* (2006.01)

(52) U.S. Cl.
CPC ..... *H03F 3/45475* (2013.01); *H03F 3/45941* (2013.01); *H03F 3/70* (2013.01); *H03M 1/785* (2013.01); *H04R 19/04* (2013.01); *H03F 2200/03* (2013.01); *H03F 2200/129* (2013.01); *H03F 2200/144* (2013.01)

(58) Field of Classification Search
CPC .......... H03F 3/70; H03F 1/34; H03F 3/45941; H03F 2200/03; H03F 2200/129; H03F 2200/144; H04R 19/04
USPC ........................................... 341/144
See application file for complete search history.

(56) References Cited

U.S. PATENT DOCUMENTS

| | | | | |
|---|---|---|---|---|
| 8,791,848 B2 * | 7/2014 | Ho | .................. | H03M 3/37 341/143 |
| 9,438,261 B2 | 9/2016 | Garcia Gonzalez et al. | | |
| 9,634,685 B2 * | 4/2017 | Francis | ............... | H03F 3/45237 |
| 9,973,198 B2 * | 5/2018 | Francis | ............... | H03F 3/45636 |
| 10,523,234 B2 * | 12/2019 | Christen | ................. | H03M 3/49 |
| 2004/0036453 A1 * | 2/2004 | Rossi | ...................... | H03F 3/005 323/242 |
| 2004/0160351 A1 * | 8/2004 | Rossi | ...................... | H03F 3/005 341/161 |
| 2014/0086433 A1 | 3/2014 | Josefsson | | |
| 2015/0061767 A1 * | 3/2015 | Francis | ............... | H03F 3/45188 330/258 |
| 2015/0137834 A1 | 5/2015 | Steiner | | |
| 2015/0295587 A1 * | 10/2015 | Garcia Gonzalez | .. | H03M 3/382 341/121 |
| 2016/0265995 A1 | 9/2016 | Wang | | |
| 2016/0352294 A1 | 12/2016 | Nicollini | | |
| 2016/0352349 A1 * | 12/2016 | Yoshioka | .................. | H03F 3/45 |
| 2017/0230054 A1 * | 8/2017 | Francis | ............... | H03F 3/45237 |
| 2018/0011125 A1 * | 1/2018 | Oshima | ................. | G01P 15/125 |

OTHER PUBLICATIONS

Datasheet digital mic "INMP421" found at https://www.invensense.com/wp-content/uploads/2015/02/INMP421.pdf; Rev Date: May 21, 2014; p. 1-22.

Du et al.: "A microphone readout interface with 74-dB SNDR" found at https://engineering.dartmouth.edu/analoglab/Publications/2014_AICSP_Mic_Readout.pdf; Analog Integr Circ Sig Process (2014); p. 241-252.

European Patent Office, International Search Report for PCT/EP2018/078878 dated Dec. 19, 2018.

* cited by examiner

SENSOR ARRANGEMENT

This disclosure relates to a sensor arrangement comprising a sensor, a sigma-delta analog-to-digital converter arrangement and an apparatus.

BACKGROUND

A capacitive sensor may be used as a MEMS (microelectromechanical system) microphone sensor. Such a sensor can be incorporated into an analog-to-digital converter (ADC) system, which provides the sensed information as digital information. The analog-to-digital converter system may use sigma-delta modulation, which is a method for encoding analog signals into digital information. Here, only the signal change is encoded, rather than the absolute value. A sigma-delta modulator comprises a feedback loop for this purpose.

In a conventional sensor interface topology, which may comprise a capacitive MEMS sensor, a downstream preamplifier and an analog-to-digital converter circuit, the sensor is not arranged within a feedback loop.

E. Bach, "A 1.8V True-Differential 140 dB SPL Full-Scale Standard CMOS MEMS Digital Microphone Exhibiting 67 dB SNR", ISSCC 2017, session 9.5 shows a MEMS microphone front-end which uses an input buffer amplifier followed by a resistive digital-to-analog converter for sigma-delta feedback. The sensor is not coupled within the feedback loop.

Dingkun Du, Kofi Odame, "A microphone readout interface with 74-dB SNDR", Analog Inter Circ Process (2014) 81: 241-252 describes an interface topology wherein the MEMS sensor is arranged outside the feedback loop.

U.S. Pat. No. 9,438,261 B2 relates to a capacitance-to-digital converter and method for providing a digital output signal, which shows how a capacitance can be measured by repeatedly charging and discharging a capacitive sensor in a switched capacitor configuration.

EP 2675188 B1 relates to a sensor arrangement and a method for generating an amplified sensor signal wherein a capacitive sensor is put into the feedback path of an analog (i.e. continuous level) amplifier loop to provide an amplified sensor signal.

Considering the digitisation process of a MEMS microphone sensor signal, it is a desire to comply with demands for low noise, low power consumption and high dynamic range in order to process large audio signals with low distortion.

SUMMARY

An aspect of the invention relates to a sensor arrangement comprising
 a sensor having a first terminal and a second terminal,
 an amplifier having an amplifier input for applying an input signal and an amplifier output for providing an amplified input signal, the amplifier input being coupled to the second terminal,
 an quantizer having a quantizer input and a quantizer output being suitable for providing a multi-level output signal on the basis of the amplified input signal,
 a feedback circuit having a feedback circuit input coupled to the quantizer output and a feedback circuit output coupled to the first terminal.
The feedback circuit comprises
 a digital-to-analog converter, being suitable for generating an analog signal on the basis of the multi-level output signal, the analog signal being the basis of a feedback signal provided at the feedback circuit output,
 a feedback capacitor that is coupled between the feedback circuit output and an output of the digital-to-analog converter, and
 a voltage source coupled to the feedback circuit output.

The sensor has a first terminal and a second terminal. The voltage between the terminals changes when the input quantity being measured, e.g. sound, changes. The sensor may be a capacitive sensor or a piezo sensor. The capacitive sensor may be a two-terminal MEMS microphone sensor. The piezo sensor may be a microphone sensor as well.

The amplifier may have a gain of one, above or below one, which also allows buffering or even attenuation. In one embodiment the amplifier may have a gain close to one; such amplifiers may be referred to as buffers. It should be mentioned that amplifying also includes buffering or even attenuating.

The quantizer replaces a quantizer input signal, which is the amplified input signal having been filtered by a loop filter, with an approximation from a finite set of discrete values, which may be two or more levels, e.g. 2, 4 or 8 levels, thereby forming a digital signal. This multi-level output signal having two or more levels is a digital input signal for the digital-to-analog converter in the feedback loop.

The multi-level output signal is the basis for the digital input signal for the digital-to-analog converter converting it to an analog voltage signal by the digital-to-analog converter arranged at the feedback circuit input; the voltage signal is a continuous signal with several levels, each representing one or more symbols of the output signal. The digital-to-analog converter may use a digital signal on the basis of the multi-level output signal. Then the voltage signal is fed back to the analog-to-digital input via the capacitive sensor. In one embodiment, the digital-to-analog converter is an inverting digital-to-analog converter. Alternatively, the inversion function may be placed anywhere else in the loop, e.g. the amplifier may perform the inversion.

The sensor arrangement addresses the above-mentioned requirements of the digitisation process when reducing a front-end amplifier input signal amplitude by operating the capacitive sensor in a feedback loop. The loop comprises a series connection of the feedback circuit and the downstream sensor being located within the loop and thereby forming part thereof. This form of sensor coupling allows adding a feedback signal provided by the feedback circuit and a sensed signal as an inherent feature of the series connection.

The feedback loop may amplify the signal change. Thus, the input signal amplitude at the amplifier front-end is reduced with respect to conventional arrangements since the amplifier has to process only the remaining quantisation noise rather than the full signal. This design is more efficient because the amplifier gain can be set to larger values, which allows suppressing the noise contribution by circuit elements further back in the signal path. The smaller amplifier input signal allows to provide a simpler amplifier design. Moreover, the smaller amplifier input signal simplifies high-impedance input DC biasing of the amplifier.

Conventional sigma-delta modulation, which includes subtraction of the modulated reference from the signal, normally requires a dedicated circuit. However, in a sigma-delta analog-to-digital converter arrangement based on the above-mentioned sensor arrangement, analog-to-digital conversion is efficiently performed by the series connection of the sensor and the modulated reference voltage from the digital-to-analog converter, both arranged in the loop. This topology allows using a simple two-terminal MEMS sensor as a capacitive sensor. No complex differential MEMS sensor is needed. The supported maximum sensor signal is larger, which means that it has a higher acoustical overload point (AOP), because most signal components are not applied to the amplifier side of the sensor but to the other side, which is driven by the digital-to-analog converter in the loop. Therefore, the amplitude limitation comes from the digital-to-analog converter output voltage range, which can be adjusted in such a manner that it is close to the supply voltage. This differs from the maximum amplifier input range of a conventional arrangement, which would be limited by an additional input transistor threshold voltage and/or by a DC biasing circuit at the input.

The feedback circuit comprises a voltage source circuit downstream of the inverting digital-to-analog converter. The voltage source circuit of the feedback circuit, which comprises the feedback capacitor and the voltage source, provides a bias voltage at the feedback circuit output, the voltage depending on the analog signal provided by the digital-to-analog converter. Coupling the feedback circuit to the first terminal of the sensor allows feeding back the analog signal of the digital-to-analog converter to the high-voltage side of the sensor. Due to the integration of the sensor inside the loop, the signal provided by the sensor's second terminal to the amplifier already includes feedback information in the form of the voltage applied to the sensor's first terminal and sensed information which may change the voltage across the sensor.

The voltage source circuit further comprises the feedback capacitor, which is coupled between the feedback circuit output and an output of the digital-to-analog converter, and a voltage source coupled to the feedback circuit output by a high-resistive component, which prevents current flow. The feedback capacitor serves as a level shifter providing the output signal information to the feedback circuit output. The voltage source provides a sufficient bias voltage across the sensor. In one embodiment, the voltage source provides a fixed voltage. Nevertheless, the voltage at the feedback circuit output depends on the analog signal. It should be mentioned that coupling the feedback capacitor between the feedback circuit output and the output of the digital-to-analog converter may include further components between the feedback circuit output and the output of the digital-to-analog converter.

Addition of sensed and feedback information is performed by the series connection of the digital-to-analog converter dependent voltage source circuit and the sensor; thereby only a single path enters the front-end amplifier and integrator, which differs from conventional approaches, where two paths are added at an input node of an integrator.

The sensor arrangement described above does not need repeated switching for charging and discharging the capacitive sensor. The sensor capacitor is pre-charged to a high DC biasing voltage only once at operation start-up; the high DC biasing voltage is kept constant during operation due to the high-impedance connection to the sensor charge. In other words, the charge stored in the sensor may be considered to be kept constant, and the sensor merely acts as a floating voltage source. Thus, the sensor arrangement may be used for small sensor capacitances in the sub-picofarad range at noise targets well below 10 µV in the audio band because there is no kT/C noise introduced from switching.

In one embodiment, the output of the digital-to-analog converter provides an analog signal controlling the voltage source, thereby controlling the voltage provided by the voltage source in a direct manner. The voltage source may be coupled between the feedback circuit output and the output of the digital-to-analog converter, or the output of the digital-to-analog converter may be coupled to a control input of the voltage source.

One embodiment of the sensor arrangement comprises circuitry for biasing an operating point of the amplifier, which allows for a stable operation of the amplifier. The circuitry for biasing may comprise one selected from the group consisting of a resistor coupled between the output of the digital-to-analog converter and the amplifier, antiparallelly coupled diodes, and a transconductance amplifier. Such circuitry which may be coupled between the amplifier's input and the feedback circuit may allow to remove absolute DC quantity, thereby serving as high-pass filter.

In one embodiment, the digital-to-analog converter comprises a charge pump, which allows to provide a wider range analog signal. The charge pump may supply a resistor ladder arrangement providing analog signal levels, the resistor ladder arrangement serving as a resistive divider. The charge pump allows to increase the digital-to-analog converter output range beyond a supply voltage of the circuit.

In one embodiment, the feedback circuit comprises a splitter, also referred to as a digital splitter, having a splitter input, to which the multi-level output signal is applied, and a first splitter output, which provides a first splitter signal for the digital-to-analog converter, also referred to as a first digital-to-analog converter, and a second splitter output, which provides a second splitter signal for a further digital-to-analog converter, also referred to as a second digital-to-analog converter. The second digital-to-analog converter may be an inverting digital-to-analog converter. The splitter allows providing signals for two feedback arms, one coupling part of the output signal to the first terminal as described above, one coupling part of the output signal to a signal adder downstream of the amplifier or to a further amplifier input. In other words, the latter part does not run through the loop that includes the sensor. The output signal may comprise low order levels being the basis of the second splitter signal and high order levels being the basis of the first splitter signal.

If there is no splitter, the entire feedback will be injected at a far end high-voltage side of the sensor. When providing a splitter, only part of the feedback is injected at the far end of the sensor. Splitting the multi-level output signal for digital-to-analog conversion causes part of it to be fed back to the high-voltage side of the sensor, and another part to be fed back to the front-end amplifier, either at the input or output of the latter.

In the above-mentioned sensor arrangement the first and second digital-to-analog converters may comprise a same resistor ladder arrangement, resulting in a less demanding circuitry.

The embodiments of a sensor arrangement as described above may be used in a sigma-delta analog-to-digital converter arrangement, which provides a multi-level digital output signal in dependence of the sensed information. Sigma-delta modulation allows to provide an analog-to-digital converter arrangement with oversampling and noise shaping.

The capacitive sensor in such a high-impedance configuration is located inside the feedback loop of the analog-to-digital converter arrangement. In other words, the entire sensor is placed in the sigma-delta analog-to-digital converter's feedback loop, rather than at the input of a signal processing chain, the latter being a conventional topology. The series connection formed by the feedback circuit including the digital-to-analog converter and the sensor performs the voltage addition operation needed at the front-end of the sigma-delta analog-to-digital converter arrangement.

If the capacitive sensor is a two-terminal capacitive MEMS microphone sensor or any other type of a capacitive sensor, it can be properly incorporated into an analog-to-digital converter arrangement by placing it in the feedback path or digital feedback loop of the sigma-delta loop. Microphones can be used in a broad spectrum of applications, e.g. medical equipment, a device of mobile communication or a vehicle.

BRIEF DESCRIPTION OF THE DRAWINGS

Non-limiting, exemplary embodiments of embodiments of the invention will now be described with reference to the accompanying drawings, in which.

DETAILED DESCRIPTION

Figure 1:
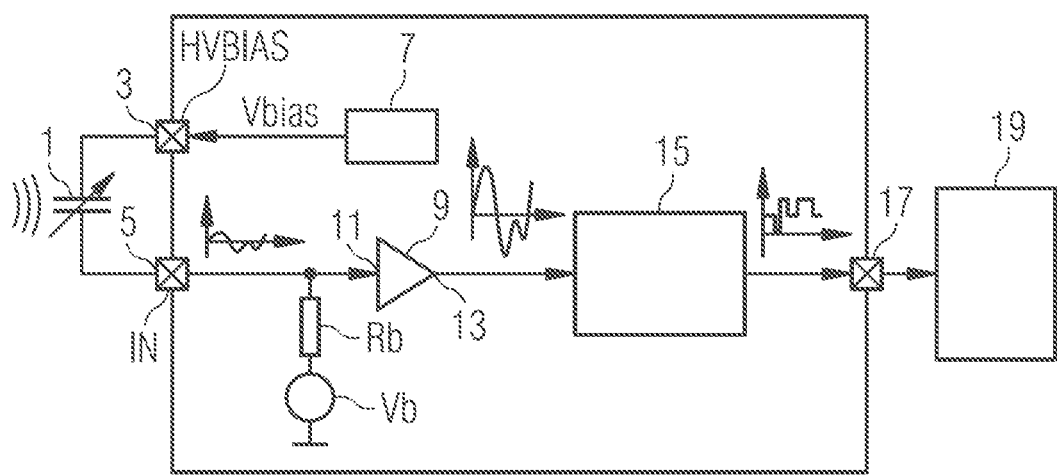
FIG. 1 illustrates an exemplary conventional sensor interfacing circuit topology.

FIG. 1 illustrates an exemplary conventional sensor interfacing circuit topology. FIG. 1 shows an embodiment of a MEMS microphone interface integrated circuit (IC) having a digital output 17 and being connected to a two-terminal MEMS sensor element which is a capacitive sensor 1. The voltage across the MEMS microphone depends on sensed sound waves.

The sensor 1 has a first terminal 3, to which a constant high bias voltage Vbias is applied. The bias voltage Vbias is provided by a charge pump 7. The sensor 1 has a second terminal 5 coupled to an amplifier input 11 of a high-impedance amplifier 9 which is also referred to as a preamplifier. The sensor 1 is coupled in such a manner that a changing capacitance of the sensor 1 generates a voltage signal at the amplifier input 11. A first potential node HVBIAS is located between the first terminal 3 and the charge pump 7. A second potential node IN is located between the second terminal 5 and the amplifier input 11. The first and second potential nodes HVBIAS, IN as well as the output 17 may be referred to as interface nodes of an integrated circuit to which the sensor 1 is connected.

DC biasing of the amplifier input 11 is established by way of a high-impedance circuit comprising a series connection of a resistor Rb and a voltage source Vb. The amplified/buffered signal provided at an amplifier output 13 is forwarded to an analog-to-digital converter circuit 15, also referred to as ADC block, converting the amplified signal to a digital signal, which may be referred to as data at the output 17 of the integrated circuit. A digital signal processing block 19 may be coupled downstream of the output 17. The nature of the analog signals at the amplifier input 11 and output 13 and the nature of the digital signal at the analog-to-digital converter circuit's output are illustrated by small schematic diagrams in FIG. 1.

Figure 2:
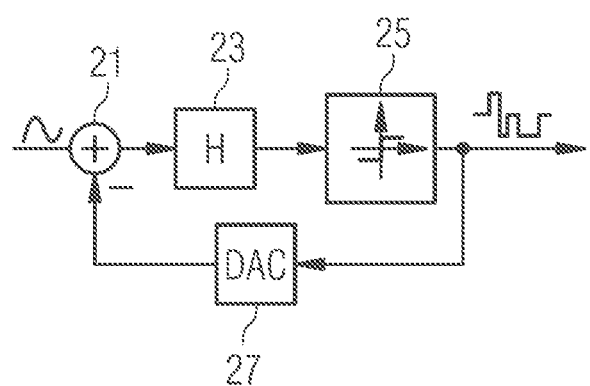
FIG. 2 illustrates an exemplary conventional analog-to-digital topology.

FIG. 2 illustrates a conventional analog-to-digital topology. FIG. 2 shows an embodiment of a block diagram of a typical sigma-delta analog-to-digital converter arrangement employed in the analog-to-digital converter circuit 15 of FIG. 1. The sigma-delta analog-to-digital converter arrangement comprises a subtractor 21 to which an analog input signal is applied, a loop filter 23 coupled downstream of the subtractor 21, and a quantizer 25 coupled downstream of the loop filter 23. The quantizer 25 provides a digital output signal that may have two or more levels. The sigma-delta analog-to-digital converter arrangement further comprises a feedback digital-to-analog converter 27, which is also referred to as DAC, the digital-to-analog converter 27 being coupled between the output of the quantizer 25 and the subtractor 21 and generating a signal that is subtracted from the analog input signal provided by the amplifier output 13.

Figure 3:
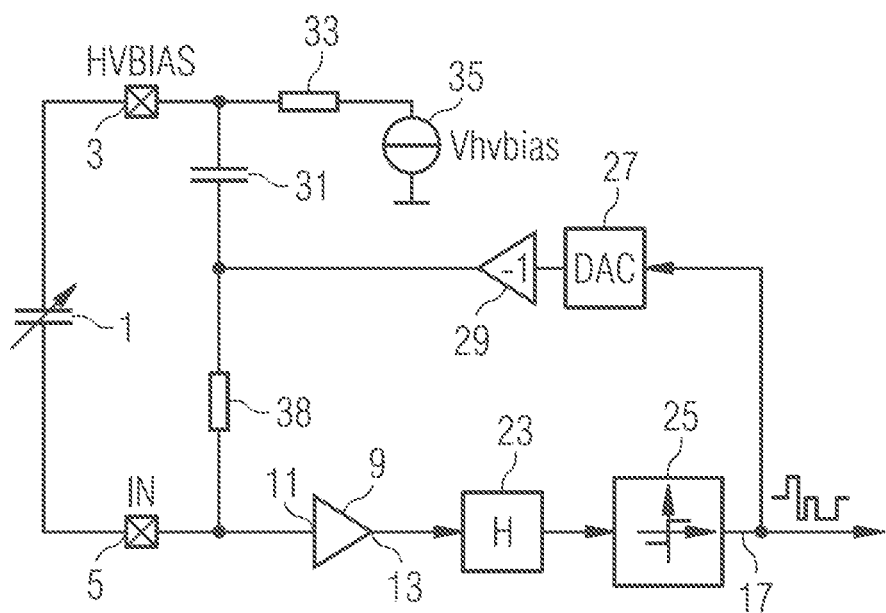
FIG. 3 shows an embodiment of a sensor arrangement.

FIG. 3 shows an embodiment of a sensor arrangement illustrating an analog-to-digital converter arrangement circuit topology. Such a sensor arrangement allows to provide MEMS microphone interface ASICs with a digital output.

The circuit comprises a capacitive sensor 1, which is a MEMS sensor, having a first terminal 3 and a second terminal 5.

The first and second terminals 3, 5 are connected to first and second potential nodes HVBIAS, IN, which may be considered as interface nodes of an integrated circuit to which the sensor 1 may be connected.

The second terminal 5 is coupled to an amplifier input 11 of an amplifier 9. A loop filter 23 is coupled downstream of an amplifier output 13. A quantizer 25 is coupled downstream of the loop filter 23. The quantizer 25 provides a digital multi-level output signal with two or more levels at its output 17. The output signal is coupled via a feedback circuit to the first potential node HVBIAS.

The feedback circuit comprises a digital-to-analog converter 27, to which the output signal is applied. An inverter 29 is coupled downstream of the digital-to-analog converter 27, thereby forming an inverting digital-to-analog converter which provides an inverted DAC voltage signal, which is an analog signal. Alternatively, the digital-to-analog converter 27 and the inverter 29 may be arranged in reversed order, thereby also forming an inverting digital-to-analog converter. It should be mentioned that the digital-to-analog converter 27 and the inverter 29 may be embodied in a single block. The inverter 29 is coupled via a feedback capacitor 31 to the first terminal 3, the first potential node HVBIAS being located between the feedback capacitor 31 and the first terminal 3. A series connection of a resistor 33 and a voltage source 35 providing a voltage Vhvbias is coupled between the first potential node HVBIAS and a ground potential. The resistor 33 is a high-impedance resistor in order to prevent current flow to the voltage source 35, which provides the bias voltage Vhvbias for the sensor 1 at the first potential node HVBIAS. Alternative components or circuits that may serve as a highly resistive element may be coupled between the first potential node HVBIAS and the ground potential.

A feedback path is formed from the output 17 via the digital-to-analog converter 27, the inverter 29, the feedback capacitor 31 and the sensor 1 to the amplifier input 11. In other words: the capacitive sensor 1 is located inside the feedback loop of a sigma-delta analog-to-digital converter arrangement. The feedback capacitor 31, which is arranged between the feedback digital-to-analog converter's output inverter 29 and the sensor 1, acts as a DC voltage level shifter in such a manner that the inverted DAC voltage signal is also present at the first terminal 3 of the sensor 1 but shifted up by the DC bias voltage Vhvbias.

The amplifier input 11 is coupled via a resistor 38 to the feedback capacitor 31, thereby stabilizing the operation of the amplifier 9. The resistor 38 is a high-impedance resistor in order to prevent current flow.

The loop filter 23, which has a very high gain in the signal frequency band, amplifies the voltage signal at the second potential node IN towards the digital-to-analog converter 27.

The digital-to-analog converter 27 generates a voltage feedback signal on the basis of the output signal which counteracts the voltage at the second potential node IN across the feedback capacitor 31 and the sensor 1 in the feedback path. As a result, the remaining signal at the second potential node IN is regulated down to a residual quantisation error of the quantizer 25 and the digital-to-analog converter 27. The amplifier 9 merely has to process the small remaining signal. The voltage addition operation, which is done in an explicit circuit in conventional topologies, is now intrinsically performed by the series connection of the digital-to-analog converter's output and the sensor 1.

The high-impedance resistor 38 establishes a DC operating point of the amplifier input 11. Stabilising the DC operating point may be implemented in various ways, e.g. by way of antiparallel diodes, with a transconductance amplifier or with a dedicated digital-to-analog converter. In one embodiment, a resistor element as shown in FIG. 3 comprising a very highly resistive material is used. The required tau is usually larger than 5 ms to not dampen the signal in the audio band. The parameters of the element need to be larger than 5 GΩ with e.g. 1 pF sensor capacitance. In one embodiment, one pair of antiparallel diodes or a series connection of multiple pairs of antiparallel diodes may stabilise the DC operating point. In one embodiment, a resistive divider and one pair of antiparallel diodes is used. In one embodiment, a transconductance amplifier having a large capacitor at the output and antiparallel diodes are used for stabilising the DC operating point.

It should be mentioned that the circuitry for stabilisation as mentioned above may also or alternatively be connected between the amplifier input 11 and the digital output 17 with a dedicated digital-to-analog converter.

Figure 4:
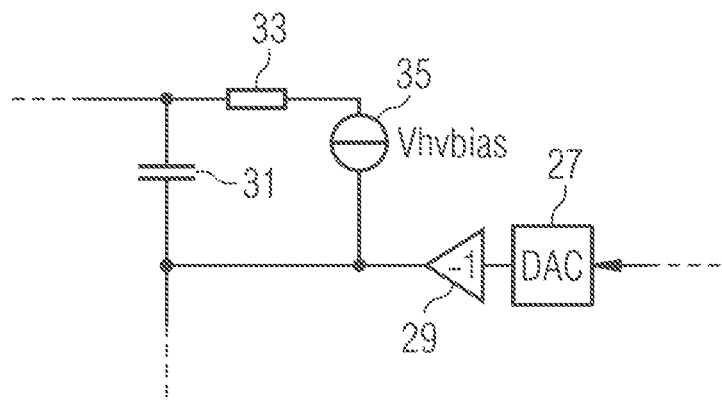
FIGS. 4 and 5 show embodiments of coupling digital-to-analog converters to voltage sources.
Figure 5:
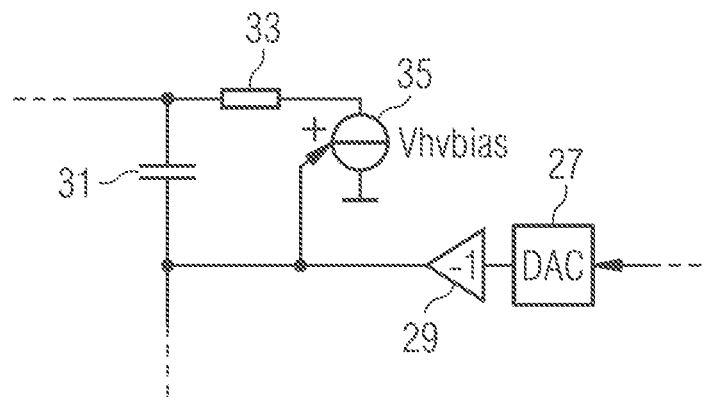

FIGS. 4 and 5 show embodiments of coupling the inverting digital-to-analog converter's 27, 29 output to the feedback capacitor 31 and the voltage source 35, which provide feedback through biasing the voltage source 35 in different ways, as described in connection with FIG. 3.

FIG. 4 illustrates how the DAC feedback can be supplied to the biasing voltage source 35 by connecting it to the terminal of the source 35 that is not connected to the resistor 33. FIG. 5 illustrates how the DAC feedback can be supplied to the biasing voltage source 35 by modifying the whole source 35 in such a manner that the feedback voltage is added. In either way, the voltage sources in FIGS. 4 and 5 are controlled by the inverting digital-to-analog converter's output.

The approaches described in connection with FIGS. 4 and 5 allow to keep the voltage signal across the resistor 33 small (ideally zero), which simplifies the resistor element's design. For example, the resistor element can be embodied as a simple diode serving as a resistor. This approach would not work with a large signal across the diode. A practical implementation of the high voltage source 35 is a charge pump, wherein either an input node of a first stage is connected to the DAC feedback signal voltage, or a reference voltage for one of the stages is connected to the DAC feedback signal.

Figure 6:
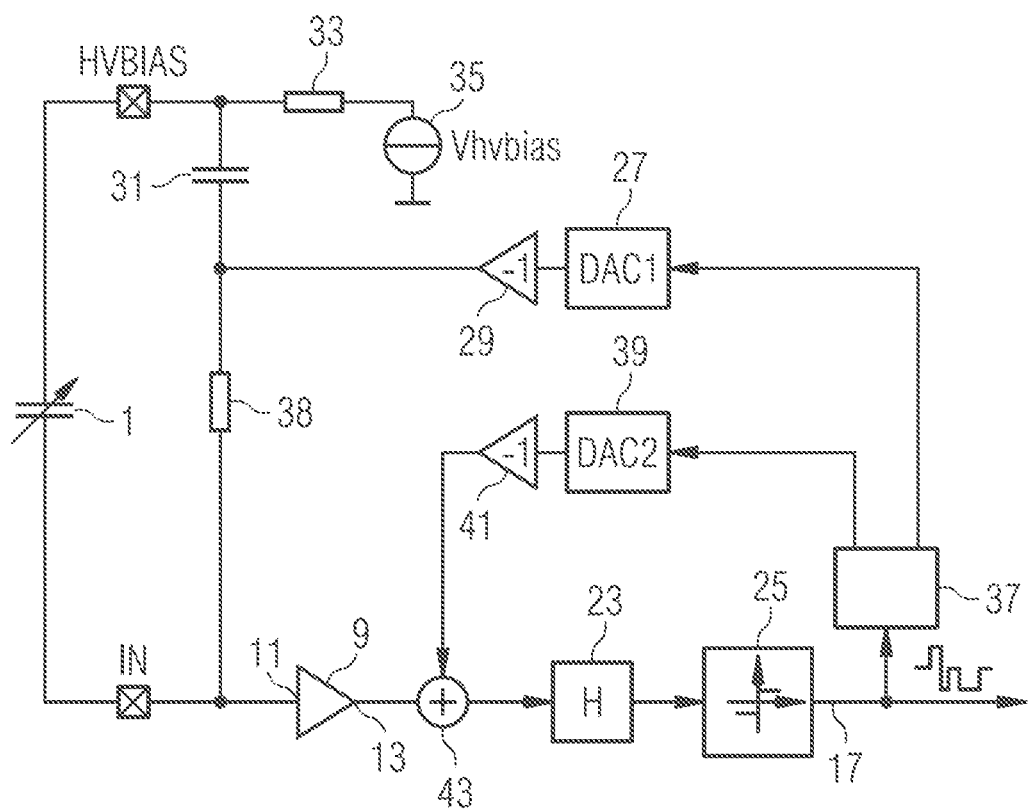
FIG. 6 shows a further embodiment of a sensor arrangement.

FIG. 6 shows a further embodiment of a sensor arrangement illustrating an analog-to-digital arrangement circuit topology. To avoid repetition of the description, only the differences with respect to the embodiment as shown in FIG. 3 will be described.

The arrangement shown in FIG. 6 is extended by a further feedback path. The sensor arrangement comprises a digital splitter 37 coupled downstream of the quantizer 25, which provides the output signal. The digital splitter 37 has one input for applying the output signal and two outputs for providing first and second splitter signals for first and second feedback paths, respectively. The multi-level output signal comprises low order levels being the basis of the second splitter signal and high order levels being the basis of the first splitter signal. The first splitter signal is provided to a first digital-to-analog converter 27 and a downstream first inverter 29 which is coupled to the feedback capacitor 31. The second splitter signal is provided to a second digital-to-analog converter 39 and a downstream second inverter 41. The first digital-to-analog converter 27 and the first inverter 29 as well as the second digital-to-analog converter 39 and the second inverter 41 form first and second inverting digital-to-analog converters, which may be alternatively embodied as described in connection with FIG. 3.

An adder 43 is coupled to the second inverting digital-to-analog converter 39, 41, the amplifier output 13 and the loop filter 23 in such a manner that the sum of the amplifier output 13 and the second inverting digital-to-analog converter's output is provided to the loop filter 23.

In this embodiment, the digital splitter logic derives two DAC feedback signals from the quantizer's output in such a manner that the sum of the two signals would again correspond to the signal. However, the two DAC signals are fed back at two different points of the sensor arrangement: The DAC signal of the first digital-to-analog converter 27 is fed back to the sensor 1, and the DAC signal of the second digital-to-analog converter 39 is fed back to the modulator input according to a topology as illustrated in FIG. 2.

Figure 8:
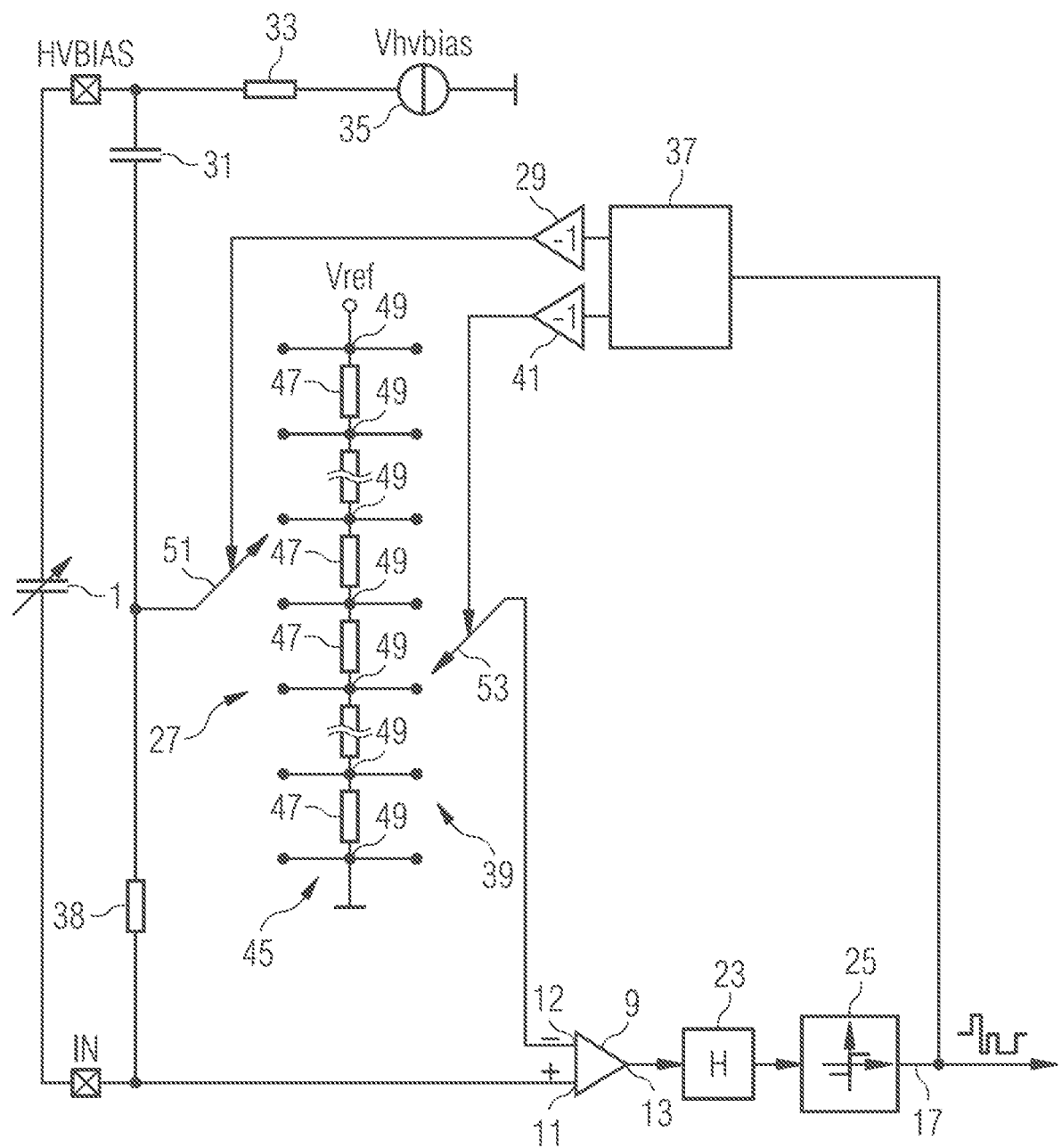
FIG. 8 shows a further embodiment of a sensor arrangement.

Alternatively, the DAC signal of the second digital-to-analog converter 39 can also be fed back to a second input of the amplifier (not shown in FIG. 6 but in FIG. 8). In a simple embodiment, the digital splitter 37 provides only the least significant levels to the second digital-to-analog converter 39, and the other (more significant) levels to the first digital-to-analog converter 27.

The above-mentioned approach allows to address the problem of inaccurate reproduction of the DAC signal of the first digital-to-analog converter 27 at the first potential node HVBIAS due to errors in voltage level shifting, which may cause ISI (intersymbol interference) problems if the larger feedback loop across the sensor 1 is not fast enough.

Moreover, fast activity processing of the least significant levels could be restrained to the on-chip circuitry, while the DAC signal of the first digital-to-analog converter 27 and thereby the voltage at the first potential node HVBIAS stay constant for small sensor signals, which may be an advantage for high-frequency emissions. A drawback is that mismatch between the first feedback path and the second feedback path leads to signal distortion. An appropriate algorithm implemented in the digital splitter 37 allows adjusting this trade-off between signal distortion and other constraints.

Figure 7:
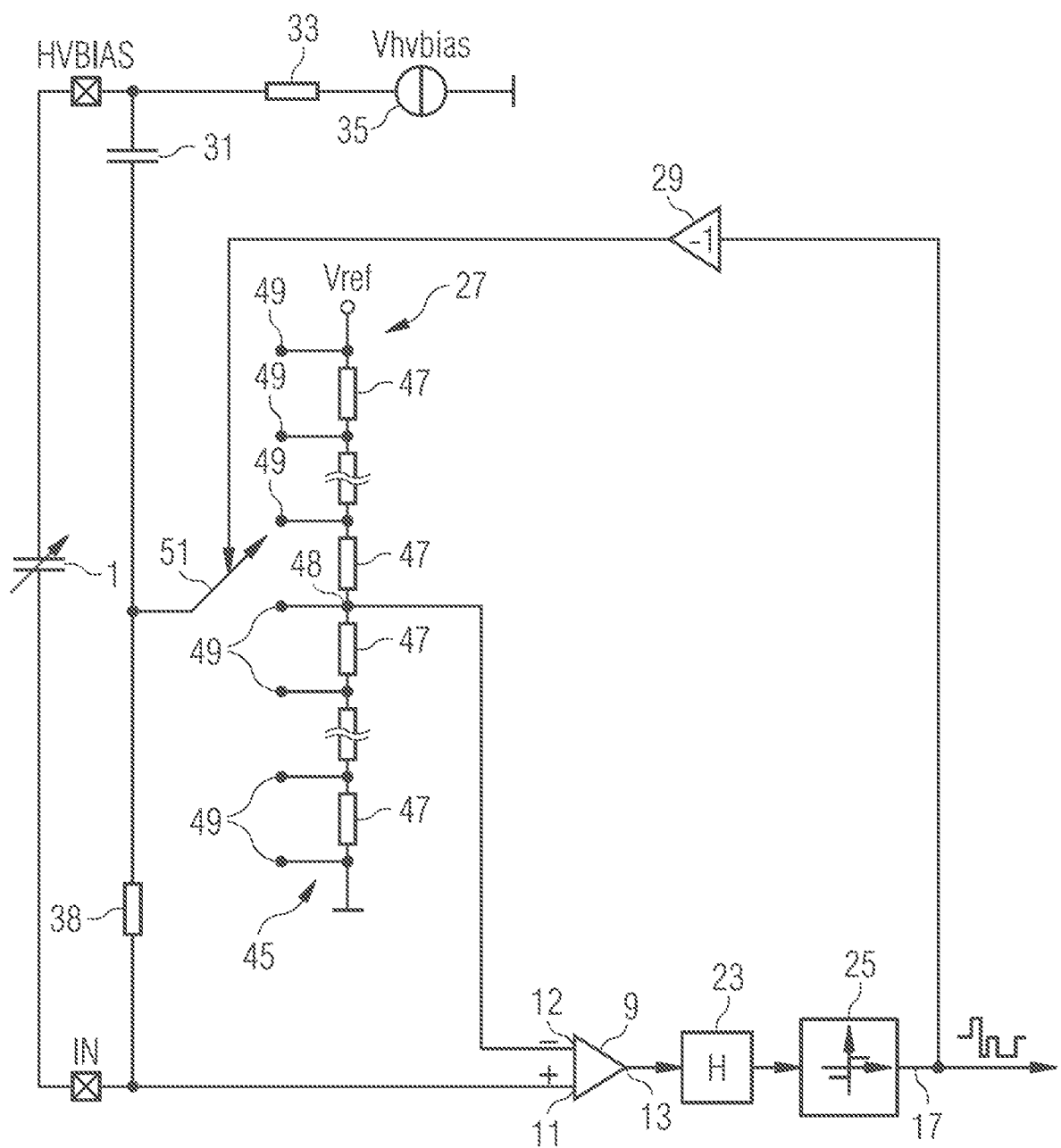
FIG. 7 shows a further embodiment of a sensor arrangement.

FIG. 7 shows an embodiment of a sensor arrangement illustrating an embodiment of the digital-to-analog converter 27 in detail. The circuit topology is based on the embodiment shown in FIG. 3. To avoid repetition of the description, only the differences with respect to the embodiment as shown in FIG. 3 will be described.

The digital-to-analog converter 27 is coupled downstream of the inverter 29 in this embodiment. The digital-to-analog converter 27 comprises a resistor ladder 45 including a series connection of a multitude of resistors 47 coupled between a reference voltage Vref and ground. The resistors 47 may have the same resistance. The resistor ladder 45 serves as a voltage divider providing fractions of the reference voltage Vref at potential nodes 49 located between neighbouring resistors 47. One of these voltage fractions is digitally selected in dependence of the digital quantizer output's value, which is performed by tapping the voltage fraction at one of the potential nodes 49 in dependence of the information to be transformed into an analog value; the tapped voltage is applied to the feedback capacitor 31 via a tapping circuitry 51.

The amplifier 9 has a further input 12 connected to a middle potential node 48 of the ladder 45, which provides half of the reference voltage Vref to the further input 12; this connection forms a reference path. The amplifier 9 amplifies the voltage difference between the first potential node HVBIAS and the middle node 48 of the resistor ladder 45. Thus, the noise contribution of the reference path is small for small signals, because the digitally selected resistor ladder node 49 is close to the further amplifier input 12, resulting in a small voltage difference and hence a small voltage noise, which relaxes the reference voltage noise constraints and the constraints on the resistor ladder's thermal noise, thus allowing for larger resistors and thereby smaller power consumption.

This approach limits the reference noise impact to high signal levels while suppressing reference noise at small signals. The resulting signal-amplitude-dependent noise is an acceptable property for audio applications and relaxes reference noise requirements.

The maximum selectable voltage range of the resistor ladder 45 is limited by the reference voltage Vref being limited by the minimum supply voltage. To overcome this limitation, the circuit may further comprises a charge pump that provides a supply voltage larger than the main supply of the reference voltage Vref generating circuit.

It should be mentioned that the above-mentioned ladder design may also be used in the embodiment shown in FIG. 6.

FIG. 8 shows an embodiment of the sensor arrangement being based on the embodiment shown in FIG. 6 and illustrates in detail an embodiment of the digital-to-analog converters 27, 39, which are coupled downstream of the first and second inverters 29 in this embodiment.

In this embodiment the output signal is split into the first and second splitter signals by the digital splitter 37. Thus, digital-to-analog conversion needs to be performed twice. However, a same resistor ladder 45 may be used for the first and second digital-to-analog converters 27, 39. The resistor ladder 45 includes a series connection of a multitude of resistors 47 and potential nodes 49 located between neighbouring resistors 47, which are arranged in the same way as described in connection with FIG. 7.

Two tapping circuitries 51, 53, one for the first DAC signal and one for the second DAC signal, may tap the voltage at the potential nodes 49, each for their own signal. The converted second DAC signal is fed to the further amplifier input 12. The converted first DAC signal is fed via the feedback capacitor 31 to the sensor 1.

FIG. 8 shows a development of the digital-to-analog converter design shown in FIG. 7. The amplifier input levels of both amplifier inputs 11, 12 are digitally selected from the same resistor ladder 45. The digital splitter 37 splits the output signal in such a manner that the voltage difference between the two selected resistor ladder nodes still corresponds to the target feedback value. Advantages of this approach are: the selectable voltage difference, and thus the maximum sensor signal, can be increased for a given supply voltage. As already described in connection with FIG. 6, there is also an additional degree of freedom to select an appropriate algorithm for the digital splitter 37. For example, only the tapping circuitry 51 for the first splitter signal may be used in the case of high amplitudes where potential artefacts at the first potential node HVBIAS caused by switching the voltage can be accepted and/or can be used to align the tapped level for the second splitter signal to the range of common mode voltages the amplifier 9 can support.

The scope of protection is not limited to the examples given herein above. The proposed sensor arrangement is embodied in each novel characteristic and each combination of characteristics, which particularly includes every combination of any features which are stated in the claims, even if this feature or this combination of features is not explicitly stated in the claims or in the examples.

The invention claimed is:

1. A sensor arrangement comprising:
   a sensor having a first terminal and a second terminal,
   an amplifier having an amplifier input for applying an input signal and an amplifier output for providing an amplified input signal, the amplifier input being coupled to the second terminal,
   a loop filter coupled downstream of the amplifier output,
   a quantizer having a quantizer input and a quantizer output configured to provide a multi-level output signal, which has at least two levels, on the basis of the amplified input signal, the quantizer being coupled downstream of the loop filter,
   a feedback circuit having a feedback circuit input coupled to the quantizer output and a feedback circuit output coupled to the first terminal, the feedback circuit comprising:
      an digital-to-analog converter, configured to generate an analog signal on the basis of the multi-level output signal, the analog signal being the basis of a feedback signal provided at the feedback circuit output,
      a feedback capacitor that is coupled between the feedback circuit output and an output of the digital-to-analog converter, and a voltage source coupled to the feedback circuit output.

2. The sensor arrangement according to claim 1, wherein the output of the digital-to-analog converter provides a signal controlling the voltage source.

3. The sensor arrangement according to claim 1, further comprising circuitry for biasing an operating point of the amplifier.

4. The sensor arrangement according to claim 3, wherein the circuitry for biasing comprises one selected from the group consisting of a resistor coupled between the output of the digital-to-analog converter and the amplifier, antiparallelly coupled diodes, and a transconductance amplifier.

5. The sensor arrangement according to claim 1, wherein the feedback circuit comprises a splitter having a splitter input, to which the multi-level output signal is applied, and a first splitter output, which provides a first splitter signal for the digital-to-analog converter, and a second splitter output, which provides a second splitter signal for a further digital-to-analog converter.

6. The sensor arrangement according to claim 5, wherein an output of the further digital-to-analog converter is coupled to a signal adder downstream of the amplifier or to a further amplifier input.

7. The sensor arrangement according to claim 5, wherein the multi-level output signal comprises low order levels being the basis of the second splitter signal and high order levels being the basis of the first splitter signal.

8. The sensor arrangement according to claim 1, wherein the digital-to-analog converter comprises a charge pump.

9. The sensor arrangement according to claim 1, wherein the digital-to-analog converter comprises a resistor ladder arrangement.

10. The sensor arrangement according to claim 5, wherein the digital-to-analog converter and the further digital-to-analog converter comprise a same resistor ladder arrangement.

11. The sensor arrangement according to claim 1, wherein the sensor is a capacitive sensor or a piezo sensor.

12. The sensor arrangement according to claim 1, wherein the sensor is a microphone sensor.

13. A sigma-delta analog-to-digital converter arrangement comprising the sensor arrangement according to claim 1.

14. Apparatus comprising the sensor arrangement according to claim 1 the apparatus being one of a medical equipment, a device for mobile communication or a vehicle.

* * * * *